United States Patent
Colombo et al.

(10) Patent No.: US 7,226,830 B2
(45) Date of Patent: Jun. 5, 2007

(54) SEMICONDUCTOR CMOS DEVICES AND METHODS WITH NMOS HIGH-K DIELECTRIC FORMED PRIOR TO CORE PMOS DIELECTRIC FORMATION

(75) Inventors: Luigi Colombo, Dallas, TX (US); James Joseph Chambers, Dallas, TX (US); Mark Robert Visokay, Richardson, TX (US)

(73) Assignee: Texas Instruments Incorporated, Dallas, TX (US)

(*) Notice: Subject to any disclaimer, the term of this patent is extended or adjusted under 35 U.S.C. 154(b) by 42 days.

(21) Appl. No.: 11/118,237

(22) Filed: Apr. 29, 2005

(65) Prior Publication Data

US 2006/0246716 A1 Nov. 2, 2006

(51) Int. Cl.
*H01L 21/8238* (2006.01)
(52) U.S. Cl. ............ 438/216; 438/275; 438/287; 257/E21.639
(58) Field of Classification Search ........ 438/199, 438/216, 218, 221, 223, 224, 275, 276, 287
See application file for complete search history.

(56) References Cited

U.S. PATENT DOCUMENTS

| | | | |
|---|---|---|---|
| 6,432,776 B1 * | 8/2002 | Ono | 438/275 |
| 6,528,858 B1 | 3/2003 | Yu et al. | |
| 6,538,278 B1 | 3/2003 | Chau | |
| 6,586,293 B1 * | 7/2003 | Hasegawa | 438/216 |
| 6,979,623 B2 * | 12/2005 | Rotondaro et al. | 438/287 |
| 7,026,232 B1 * | 4/2006 | Koontz et al. | 438/589 |
| 2005/0098839 A1 * | 5/2005 | Lee et al. | 438/216 |

OTHER PUBLICATIONS

U.S. Appl. No. 11/118,842, filed Apr. 29, 2005.*
U.S. Appl. No. 11/118,843, filed Apr. 29, 2005.*

* cited by examiner

*Primary Examiner*—Kevin M. Picardat
(74) *Attorney, Agent, or Firm*—Peter K. McLarty; W. James Brady, III; Frederick J. Telecky, Jr.

(57) ABSTRACT

The present invention facilitates semiconductor fabrication by providing methods of fabrication that selectively form high-k dielectric layers within NMOS regions. A first oxide layer is formed in core and I/O regions of a semiconductor device (506). The first oxide layer is removed (508) from the core region of the device. A high-k dielectric layer is formed (510) over the core and I/O regions. Then, the high-k dielectric layer is removed (512) from PMOS regions of the core and I/O regions. A second oxide layer is formed (516) within NMOS regions of the core and I/O regions and a nitridation process is performed (518) that nitrides the second oxide layer and the high-k dielectric layer.

24 Claims, 15 Drawing Sheets

CORE REGION

I/O REGION

CORE REGION

I/O REGION

CORE REGION

I/O REGION

CORE REGION

I/O REGION

CORE REGION

I/O REGION

CORE REGION

I/O REGION

CORE REGION

I/O REGION

SEMICONDUCTOR CMOS DEVICES AND METHODS WITH NMOS HIGH-K DIELECTRIC FORMED PRIOR TO CORE PMOS DIELECTRIC FORMATION

FIELD OF INVENTION

The present invention relates generally to semiconductor devices and more particularly to CMOS transistor devices and associated methods of manufacture that employ high-k dielectric layers.

BACKGROUND OF THE INVENTION

Field effect transistors (FETs) are widely used in the electronics industry for switching, amplification, filtering, and other tasks related to both analog and digital electrical signals. Most common among these are metal-oxide-semiconductor field-effect transistors (MOSFET or MOS), in which a gate is energized to create an electric field in an underlying channel region of a semiconductor body, by which electrons are allowed to travel through the channel between a source region and a drain region of the semiconductor body. Complementary MOS (CMOS) devices have become widely used in the semiconductor industry, wherein both n-channel and p-channel (NMOS and PMOS) transistors are used to fabricate logic and other circuitry.

The source and drain are typically formed by adding dopants to targeted regions of a semiconductor body on either side of the channel. A gate structure is formed above the channel, having a gate dielectric formed over the channel and a gate electrode above the gate dielectric. The gate dielectric is an insulator material, which prevents large currents from flowing into the channel when a voltage is applied to the gate electrode, while allowing such an applied gate voltage to set up an electric field in the channel region in a controllable manner. Conventional MOS transistors typically include a gate dielectric formed by depositing or growing silicon dioxide ($SiO_2$) or silicon oxynitride (SiON) over a silicon wafer surface, with doped polysilicon formed over the $SiO_2$ or SiON to act as the gate electrode.

Continuing trends in semiconductor device manufacturing include reduction in electrical device feature sizes (scaling), as well as improvements in device performance in terms of device switching speed and power consumption. MOS transistor performance may be improved by reducing the distance between the source and the drain regions under the gate electrode of the device, known as the gate or channel length, and by reducing the thickness of the layer of gate oxide that is formed over the semiconductor surface. However, there are electrical and physical limitations on the extent to which the thickness of $SiO_2$ or SiON gate dielectrics can be reduced. For example, leakage in very thin $SiO_2$ or SiON gate dielectrics is dominated by tunneling currents resulting from direct tunneling through the thin gate oxide. In addition, thin $SiO_2$ or SiON gate dielectric layers provide a poor diffusion barrier to dopants, for example, and may allow high boron dopant penetration from the poly silicon electrode into the underlying channel region of the silicon substrate during fabrication of the source/drain regions.

Recent MOS transistor scaling efforts have accordingly focused on high-k dielectric materials having dielectric constants greater than that of $SiO_2$ (e.g., greater than about 3.9) and thus can be formed in a thicker layer than $SiO_2$ or SiON, and yet produce equivalent field effect performance. The relative electrical performance of such high-k dielectric materials is often expressed as equivalent oxide thickness (EOT), because the high-k material layer may be thicker, while still providing the equivalent electrical effect of a much thinner layer of $SiO_2$ or SiON. Since the dielectric constant "k" is higher than silicon dioxide, a thicker high-k dielectric layer can be employed to mitigate tunneling leakage currents, while still achieving the equivalent electrical performance of a thinner layer of thermally grown $SiO_2$ or SiON.

The performance of the resulting MOS transistors is dependent upon the high-k gate dielectric material, including the bulk high-k material and on a thickness or equivalent oxide thickness of deposited material. Unlike $SiO_2$ or SiON, which may be formed by thermal oxidation (growth process), high-k dielectrics are typically deposited over the semiconductor substrate using chemical vapor deposition (CVD), physical vapor deposition (PVD), atomic layer deposition (ALD), molecular beam epitaxy (MBE), or other deposition processes. While the macroscopic composition of these materials may be controlled to a certain extent during such deposition processes, stoichiometric composition variations within the film may vary and thus degrade device performance.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention facilitates semiconductor fabrication by employing high-k dielectric layers in NMOS regions but not in PMOS regions of semiconductor transistor devices. NMOS devices within an I/O region having higher operation voltage requirements employ a high-k dielectric layer and a first oxide layer as dielectric layers. PMOS devices within the I/O region employ a second oxide layer and the first oxide layer as dielectric layers. NMOS devices within a core region of the device employ only the high-k dielectric layer as a dielectric layer. PMOS devices within the core region of the device employ only the second oxide layer as a dielectric layer. As a result, high-k dielectric materials are employed for the NMOS devices without negatively impacting operation of the PMOS devices.

The present invention facilitates semiconductor fabrication by providing methods of fabrication that selectively form high-k dielectric layers within NMOS regions. A first oxide layer is formed in core and I/O regions of a semiconductor device. The first oxide layer is removed from the core region of the device. A high-k dielectric layer is formed over the core and I/O regions. Then, the high-k dielectric layer is removed from PMOS regions of the core and I/O regions. A second oxide layer is formed within NMOS regions of the core and I/O regions and a nitridation process is performed that nitrides the second oxide layer and the high-k dielectric layer.

BRIEF DESCRIPTION OF THE DRAWINGS

The following description and annexed drawings set forth in detail certain illustrative aspects and implementations of the invention. These are indicative of but a few of the various ways in which the principles of the invention may be employed.

DETAILED DESCRIPTION OF THE INVENTION

Figure 1:
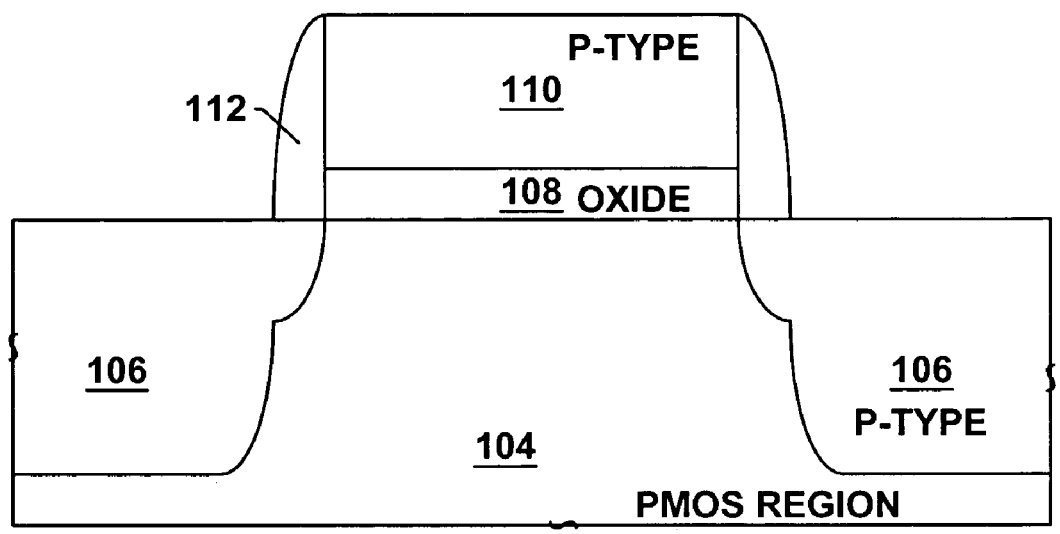
FIG. 1 is a cross sectional view of a conventional PMOS transistor device formed with oxide as a dielectric layer and a p-type doped polysilicon gate.

One or more implementations of the present invention will now be described with reference to the attached drawings, wherein like reference numerals are used to refer to like elements throughout, and wherein the illustrated structures are not necessarily drawn to scale.

It is appreciated that semiconductor devices can include transistor devices that operate at different voltages in different regions of the semiconductor device. As a result, these different devices require varied oxide based dielectric thicknesses. One conventional mechanism to account for the different types of devices is to form the transistor devices with the same oxide dielectric thickness required for the higher voltage operation. As a result, transistor devices operating at a relatively low operating voltage were fabricated with a thicker gate dielectric than necessary. This extra thickness can slow operation or speed of such devices. Accordingly, performance of the semiconductor device, particularly transistor devices within the semiconductor device that operate at a relatively lower operating voltage, can be improved. Other conventional mechanisms include using level shifters to change voltage/power levels and the like.

It is also appreciated that semiconductor devices, including those with transistor devices operating at different voltages, can employ high-k dielectric materials in order to obtain an equivalent oxide thickness, but with a thicker dielectric layer. The high-k dielectric material can overcome problems associated with employing silicon dioxide or nitrided silicon dioxide as a dielectric layer, which are discussed in further detail below. However, high-k dielectric materials can introduce problems of their own and can degrade performance of PMOS transistor devices, as discussed below.

The present invention facilitates semiconductor fabrication by providing methods of fabrication that selectively integrate high-k dielectric layers into NMOS transistors for CMOS semiconductor devices without negatively impacting PMOS transistors. Generally, use of high-k dielectric layers can permit decreased device size and improved device performance, but can present problems with PMOS devices including, but not limited to, threshold voltage shift, capacitor degradation, and polysilicon depletion. Undesirable effects resulting from the inclusion of the high-k dielectric layers, particularly with respect to PMOS devices, are mitigated by the present invention.

The present invention mitigates degradation to PMOS devices in both core and I/O regions by employing high-k dielectrics in NMOS devices and employing non-high-k dielectrics in PMOS devices. As a result, the benefits of employing high-k dielectrics for NMOS devices are retained.

FIG. 1 shows a cross sectional view of a conventional PMOS transistor device 100 formed with silicon dioxide ($SiO_2$) as a dielectric layer and a p-type doped polysilicon gate. This device 100 described is exemplary in nature and is provided to facilitate understanding of the present invention.

The device 100 comprises an n-type well region 104 formed within a p-type semiconductor substrate or body. Implanting an n-type dopant, such as phosphorous, into the semiconductor body with a relatively low dose and high energy, forms the well region 104. P-type source/drain regions 106 are formed within the well region 104. Implanting a p-type dopant, such as boron, into the well region 104 with a relatively high dose and lower energy forms the source/drain regions 106. The p-type source/drain regions can also have an extension portion or lightly doped region (LDD) between the source/drain regions and the channel.

A gate structure or stack overlies the channel and includes an oxide layer 108 and a p-type polysilicon layer 110 formed on the oxide layer 108. The silicon dioxide layer 108 (not drawn to scale) operates as a dielectric layer for the gate structure and is typically formed by a thermal growth process. The polysilicon layer 110 is formed on the silicon dioxide layer 108, after which a patterning operation is performed to form the gate structure. The polysilicon layer 110 is doped with a p-type dopant, such as boron, typically during formation of the source/drain regions 106. Sidewalls 112 are formed on lateral edges of the gate structure in order to protect the gate structure and facilitate formation of the source/drain regions 106. The sidewalls 112 can be formed by depositing an insulative material, such as silicon nitride, silicon dioxide, or both, over the device conformally and then by anisotropically etching the layer.

The device 100 operates when a sufficient voltage, referred to as a threshold voltage or greater, is applied to the polysilicon layer 110 of the gate structure. The threshold voltage generates a sufficient electric field across a channel region below the gate structure. When this happens, a conductive path is formed below the gate structure between the source/drain regions 106 allowing current to flow there between. Parameters that determine the threshold voltage are the work function the polysilicon layer 110 and the doping level in the channel region. Generally, the closer the work function is to the band edges of the silicon for the respective device types, the lower the magnitude of the threshold voltage.

A thickness of the dielectric layer 108 also affects operation of the device 100. Generally, the speed, drive current, capacitance, and other functional characteristics are determined by the thickness of the dielectric layer 108. Generally, the thinner the dielectric layer 108, the faster the device 100 can operate and the lower the magnitude of threshold voltage that can be established/tolerated. However, there are electrical and physical limitations on the extent to which thicknesses of the dielectric layer 108 can be reduced. For example, leakage in very thin silicon dioxide dielectrics is dominated by tunneling currents resulting from direct tunneling through the thin gate oxide. In addition, thin oxide layers provide a poor diffusion barrier to dopants.

Figure 2:
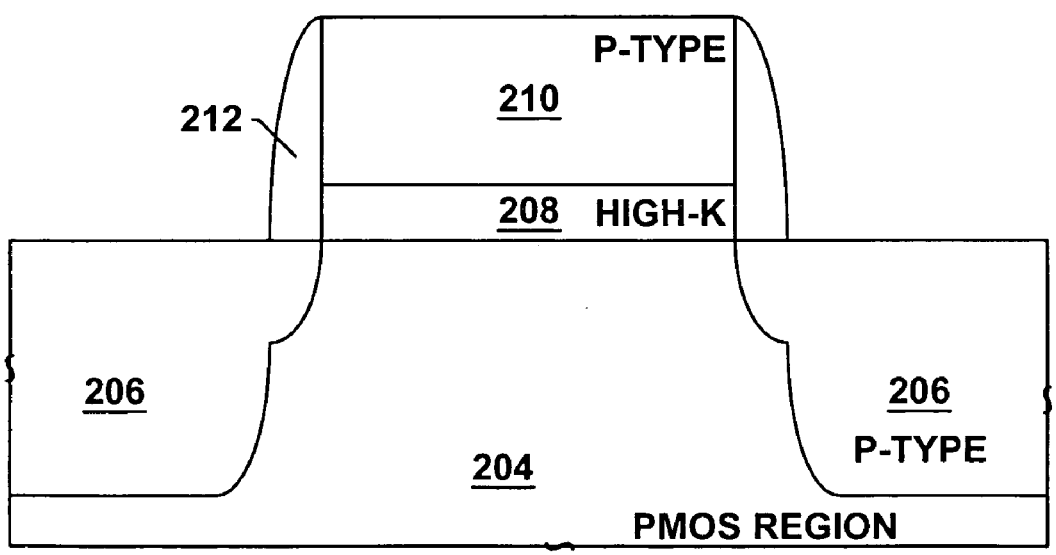
FIG. 2 is a cross sectional view of another conventional PMOS transistor device formed with a high-k dielectric layer and a p-type doped polysilicon gate.

FIG. 2 shows a cross sectional view of another conventional PMOS transistor device 200 formed with a high-k dielectric layer and a p-type doped polysilicon gate. The high-k dielectric layer permits a thicker dielectric layer to be employed with the device and yet have similar electrical properties to the thinner silicon dioxide layer of the prior art FIG. 1. The high-k dielectric layer mitigates some of the problems associated with employing silicon dioxide layers, such as, gate tunneling, leakage currents, and the like. However, employing the high-k dielectric layer with the PMOS transistor device 200 presents other problems which are discussed below. The device 200 described below is exemplary in nature and is provided to facilitate understanding of the present invention.

The device 200 comprises an n-type well region 204 formed within a semiconductor substrate or body. Implanting an n-type dopant, such as phosphorous, into the semiconductor body with a relatively low dose and high energy, forms the well region 204. P-type source/drain regions 206 are formed within the well region 204. Implanting a p-type dopant, such as boron, into the well region 204 with a relatively high dose and lower energy forms the source/drain regions 206. The p-type source/drain regions can also have an extension portion or lightly doped region (LDD).

A gate structure or stack comprises a high-k dielectric layer 208 and a p-type polysilicon layer 210 formed on the high-k dielectric layer 208. The high-k dielectric layer 208 is formed over the device using a deposition process, such as a chemical vapor deposition process (CVD) and operates as a dielectric layer for the gate structure. The layer 208 is comprised of high-k dielectric materials that have dielectric constants greater than that of $SiO_2$ (e.g., greater than about 3.9), which can be formed in a thicker layer than scaled $SiO_2$ or SiON, and yet produce equivalent field effect performance. The polysilicon layer 210 is formed on the high-k dielectric layer 208, after which a patterning operation is performed to form the gate structure. The polysilicon layer 210 is doped with a p-type dopant, such as boron, typically during formation of the source/drain regions 206. Sidewalls 212 are formed on lateral edges of the gate structure in order to protect the gate structure and facilitate formation of the source/drain regions 206. The sidewalls 212 can be formed by depositing an insulative material, such as oxide, over the device conformally and then by anisotropically etching the device.

The device 200, again, operates when a sufficient voltage, referred to as the threshold voltage, is applied to the polysilicon layer 210 of the gate structure. The threshold voltage generates a sufficient electric field across a channel region below the gate structure. When this happens, a conductive path is formed below the gate structure between the source/drain regions 206 allowing current to flow there between. A parameter that determines the threshold voltage is the work function the polysilicon layer 210, which has a concentration of p-type dopants, and the doping level in the channel region, which has a concentration of n-type dopants. Generally, the lower the work function, the lower the magnitude of the threshold voltage.

A thickness or equivalent oxide thickness of the high-k dielectric layer 208 also affects operation of the device 200. As stated above, the speed, drive current, capacitance and other functional characteristics are a function of the thickness or equivalent oxide thickness of the high-k dielectric layer 208. Generally, the thinner the high-k dielectric layer 208, the faster the device 200 can operate and the lower the magnitude of threshold voltage that can be established.

The relative electrical performance of such high-k dielectric materials is often expressed as equivalent oxide thickness (EOT), because the high-k material layer may be thicker, while still providing the equivalent electrical effect of a much thinner layer of $SiO_2$ or SiON. Since the dielectric constant "k" is higher than silicon dioxide, a thicker high-k dielectric layer can be employed to mitigate tunneling leakage currents, while still achieving the equivalent electrical performance of a thinner $SiO_2$ or SiON layer.

Use of high-k dielectric materials can have adverse effects on PMOS devices employed therein. As a result, device performance can be degraded. Generally, the use of high-k dielectric materials or layers for conventional PMOS devices results in an undesired offset in the threshold voltage and degraded inversion capacitance. One cause of the threshold voltage offset may be due to dopants present in high-k dielectric layers that result in high fixed charge density. This leads to unpredictable shifts or increases in threshold voltages that can be difficult to account for by counter doping the channel region, typically performed prior to gate formation in MOS devices. Inversion capacitance degradation occurs as a result of polysilicon depletion by the high-k gate dielectric layer. A p-type doped polysilicon gate layer experiences a depletion of positive charges near an interface with the high-k dielectric layer. As a result, the electric field present in the channel region is reduced. The polysilicon depletion effect causes the high-k dielectric layer to electrically function as if it were thicker than its true thickness. A contributing factor to the polysilicon depletion is that dopant concentration of p-type polysilicon gate layers is limited because p-type dopants, such as boron, tend to diffuse out of the p-type doped gate structures and thus resist higher dopant levels.

Figure 3:
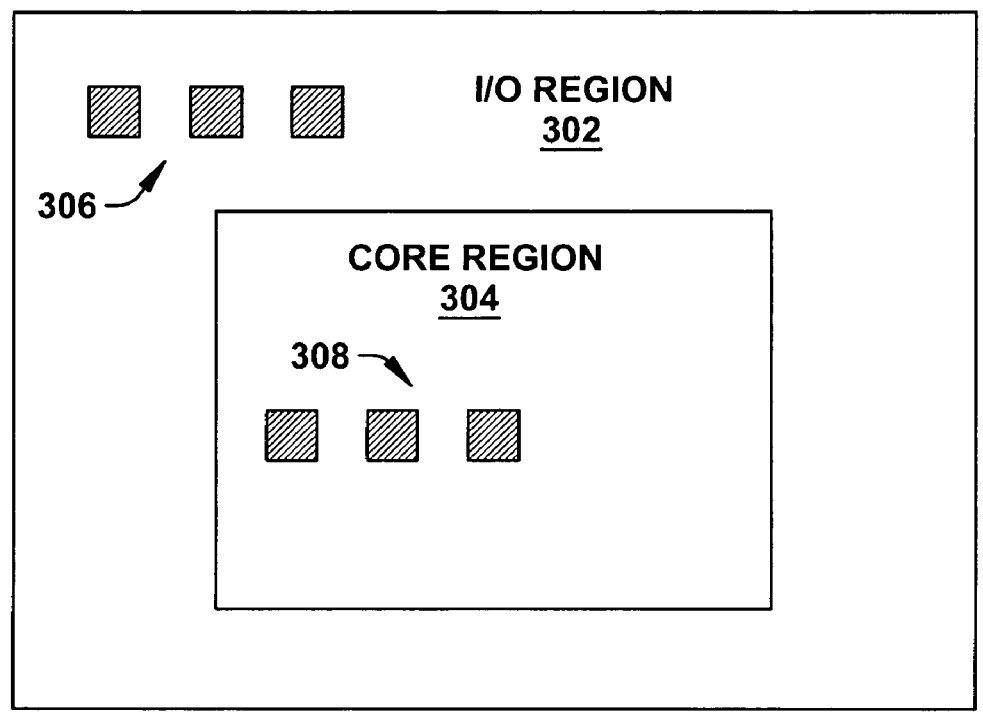
FIG. 3 is a block diagram illustrating an exemplary I/O region and an exemplary core region within a semiconductor device in accordance with an aspect of the present invention.

FIG. 3 is a block diagram illustrating an exemplary I/O region 302 and an exemplary core region 304 within a semiconductor device 300 in accordance with an aspect of the present invention. The provided diagram is exemplary in nature and is provided to facilitate understanding of the present invention.

The I/O region 302 comprises CMOS transistor devices 306, including NMOS and PMOS I/O transistor devices, which generally operate at relatively higher voltage (e.g., 1.5, 2.5, 3.3 volts) and lower speeds. The core region 304 comprises CMOS transistor devices 308, including NMOS and PMOS core transistor devices, which operate at relatively lower voltage (e.g., 1 volt) and higher speeds than the CMOS transistor devices 306 of the I/O region 302.

The I/O region 302 is generally the higher-voltage logic portion of the device 300. The I/O region 302 typically handles interfacing with external devices (data in and out of the chip), power management, voltage regulation, and the like. The transistors 306 typically, but not necessarily, operate at higher voltage than the core transistors 308 and have lower performance requirements, but are important to the overall device 300 operation.

Generally, the core region 304 can encompass low-voltage logic as well as memory functions (e.g., SRAM), including the memory array and periphery of the memory. Typically, the transistors 308 within the core region are high-performance transistors that do the bulk of the work by the device 300 and handle operations such as, calculations and the like. It is noted that memory portions of the device 300 (e.g., SRAM) can comprise both core and I/O regions.

Generally, in transistor devices, a source and drain are typically formed by adding dopants to targeted regions of a semiconductor substrate or body on either side of a channel. A gate structure is formed above the channel, having a gate dielectric or dielectric layer formed over the channel and a gate electrode above the gate dielectric. The gate dielectric is an insulator material, which prevents large currents from flowing into the channel when a voltage is applied to the gate electrode, while allowing such an applied gate voltage, also referred to as an operating voltage, to set up an electric field in the channel region in a controllable manner.

A thickness of the dielectric layer is determined by, among other things, the operating voltage and a desired speed of operation. Generally, a higher operating voltage requires a thicker dielectric layer. However, faster speed of operation requires a thinner dielectric layer. Accordingly, both factors can be at odds with each other.

Currently, two types of dielectric materials that are employed in transistor devices are silicon dioxide ($SiO_2$) or silicon oxynitride (SiON), which are typically formed over a silicon wafer surface. However, other dielectric materials, referred to as high-k dielectric materials can be employed to attain an equivalent oxide thickness that is smaller than its actual thickness. This is due to the fact that the dielectric constant for high-k dielectric materials is substantially larger than the dielectric constant of silicon dioxide, which is about 3.9.

Because of the higher voltage and lower operational speeds, the I/O CMOS transistor devices 306 can have a thicker dielectric layer, expressed in terms of equivalent oxide thickness. As a result, the thicker dielectric layer can mitigate some of the problems, such as tunneling, associated with thinner dielectric layers. In contrast, the core devices 308 require relatively thin dielectric layers to permit faster operation. NMOS devices of the I/O CMOS transistor devices 306 employ a high-k dielectric layer formed top of on a silicon oxide or nitrided silicon dioxide layer whereas PMOS devices of the I/O CMOS transistor devices 306 employ silicon oxide or silicon oxynitride. NMOS devices of the core transistor device 308 employ a layer of a high-k dielectric material and the PMOS devices of the core transistor devices employ a silicon oxide or silicon oxynitride. As a result, the NMOS devices benefit from employing high-k dielectric material without the PMOS devices being substantially negatively impacted.

Figure 4:
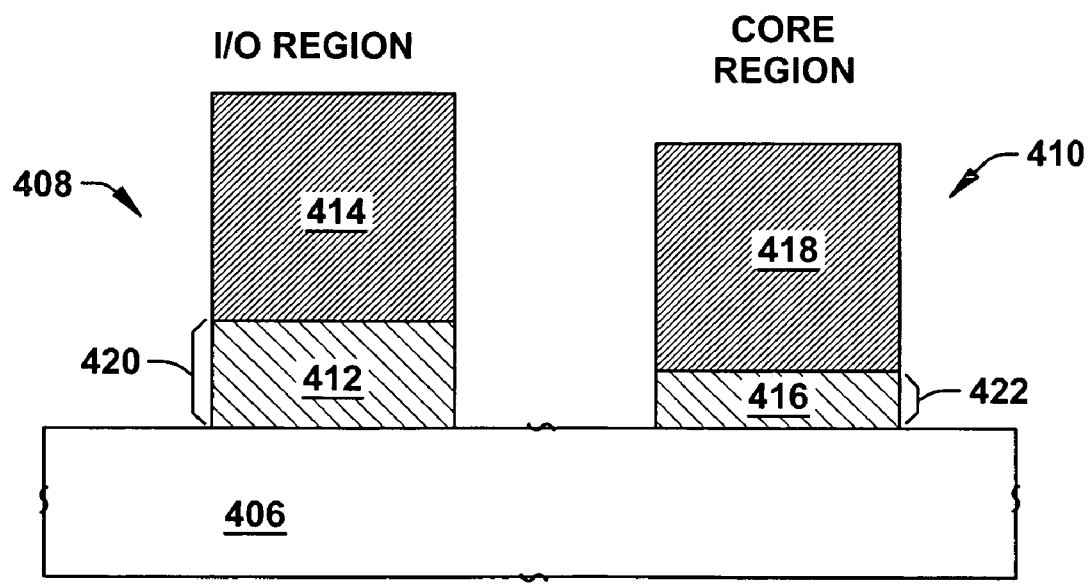
FIG. 4, a cross sectional view illustrating high and low operating voltage transistor devices in accordance with an aspect of the present invention is presented.

Turning now to FIG. 4, a cross sectional view illustrating high and low operating voltage transistor devices in accordance with an aspect of the present invention is presented. The view provided is somewhat simplified to further illustrate and compare thicknesses of dielectric layers in core and I/O regions.

A high voltage transistor device 408 is located within an I/O region and a low voltage transistor device 410 is located within a core region. The high voltage transistor device 408 has a relatively high operational voltage or applied voltage (e.g., 1.5 volts or more) whereas the low voltage transistor device 410 has a relatively low operational voltage or applied voltage (e.g., 1.0 volts).

The high voltage transistor device 408 includes a dielectric layer 412 and a gate 414. The dielectric layer 412 is comprised of a dielectric material, such as silicon dioxide, hafnium silicon oxynitride, or another suitable high-k dielectric material and has a first thickness 420, which is related to the device's operating voltage. The dielectric material varies according to whether the device 408 is a PMOS or NMOS device. Accordingly, for PMOS, the dielectric material is an oxide or oxynitride and for NMOS, the dielectric material is a high-k dielectric material formed on a silicon oxide or nitrided silicon dioxide layer. The gate 414 is comprised of an electrode material such as polysilicon, metal or metal compound and is formed on the dielectric layer 412.

The low voltage transistor device 410 also includes a dielectric layer 416 and a gate 418. Again, the dielectric layer 416 is comprised of a dielectric material, such as silicon dioxide, hafnium silicon oxynitride, or another suitable high-k dielectric material, but has a second thickness 422, which is related to the device's operating voltage. The dielectric material varies according to whether the device 410 is a PMOS or NMOS device. Accordingly, for PMOS, the dielectric material is silicon dioxide or nitrided silicon dioxide and for NMOS, the dielectric material is a high-k dielectric material. The gate 418 is comprised of an electrode material such as polysilicon or a metal or metal compound and is formed on the dielectric layer 416. Such gate is typically, but need not be the same material (and thickness) as the gate 414 for the I/O region device 408. Such gate is also typically, but need not be the same material (and thickness) on the NMOS and PMOS transistors The high voltage transistor device 408 operates at a higher operating voltage (e.g., the gate voltage) than the low voltage transistor device 410. As a result, the high voltage transistor device 408 requires a thicker dielectric layer. Accordingly, the thickness (EOT) of the dielectric layer 412 for the high voltage transistor device 408, the first thickness 420, is greater than the thickness (EOT) of the dielectric layer 416 for the low voltage transistor device 410, the second thickness 422.

By permitting the dielectric layer 416 of the low voltage transistor 410 to have a relatively small thickness, the low voltage transistor device 410 can operate at higher speeds than conventionally formed devices with thicker dielectric layers.

Figure 5:
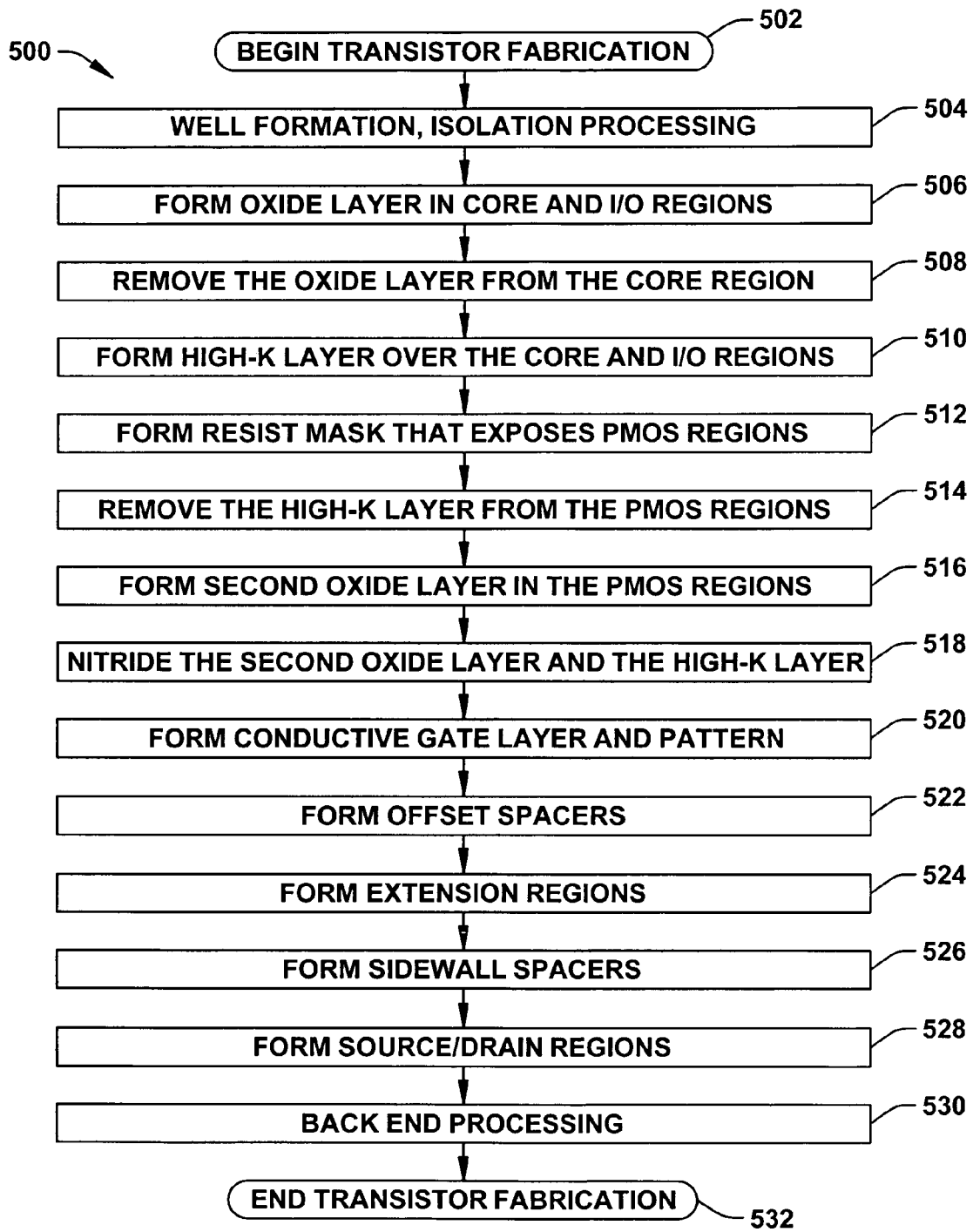
FIG. 5 is a flow diagram illustrating a method of fabricating a CMOS semiconductor device having a core region and an I/O region in accordance with an aspect of the present invention.

FIG. 5 is a flow diagram illustrating a method 500 of fabricating a CMOS semiconductor device having a core region and an I/O region in accordance with an aspect of the present invention. The method 500 selectively employs high-k dielectric materials for dielectric layers of NMOS devices, but employs silicon oxide or nitrided silicon dioxide for dielectric layers of PMOS devices thereby mitigating or avoiding problems resulting from employing high-k dielectrics with PMOS devices.

While the exemplary method 500 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the fabrication of ICs and composite transistors illustrated and described herein, as well as in association with other transistors and structures not illustrated, including but not limited to NMOS and/or PMOS composite transistors.

The method 500 begins at block 502, wherein transistor fabrication is initiated, and transistor well formation and isolation processing is performed at block 504 thereby defining NMOS and PMOS regions within core and I/O regions of a semiconductor body or substrate, wherein NMOS regions comprise a P-well in which n-type source/drain regions will later be formed, and PMOS regions comprise an N-well in which p-type source/drain regions will later be formed, respectively. In addition, isolation regions may comprise shallow trench isolation (STI) or field oxide regions (LOCOS) that serve to define various active areas and electrically isolate various active areas laterally from one another. The semiconductor body is comprised of semiconductor materials, such as silicon and/or germanium and can also comprise silicon on insulator, such as Si/SiGe/Si.

The method 500 continues at block 506, wherein a silicon dioxide ($SiO_2$) layer is formed over devices within both the core and I/O regions. In one example, the oxide layer comprises a thin, thermally grown silicon dioxide layer. Subsequently, the silicon oxide layer is patterned at block 508 in order to remove the oxide layer from the core region while retaining the silicon oxide layer in the I/O region. It is appreciated that variations of the method 500 in accordance with the present invention contemplate forming a silicon oxynitride layer in place of the silicon dioxide layer at block 506.

Continuing, a high-k dielectric layer is formed over the device at block 510 in a blanket operation in both the core and I/O regions. The high-k dielectric layer is formed by depositing a suitable high-k dielectric material, such as HfSiO, having a dielectric constant greater than 3.9. Additionally, nitrogen (N) may be introduced during the formation of the high-k dielectric layer or can be added subsequently in a nitridation process. Examples of suitable procedures to form the high-k dielectric layer are provided below.

Prior to deposition of the high-k dielectric material, a suitable surface preparation is typically performed. The surface preparation step might include the growth of an ultra-thin silicon dioxide layer with a thickness of one to six monolayers. Unlike silicon dioxide ($SiO_2$) or silicon oxynitride (SiON), which may be formed by thermal oxidation (growth process), the high-k dielectric layer is formed by depositing a high-k dielectric material over the device, using chemical vapor deposition (CVD), physical vapor deposition (PVD), atomic layer deposition (ALD), molecular beam epitaxy (MBE), or other suitable deposition processes. The deposition process is performed so as to yield a thickness that results in a desired or selected equivalent oxide thickness (EOT) on the core and I/O NMOS devices. As stated above, high-k dielectric materials have dielectric constants that are greater than that of silicon dioxide (e.g., greater than about 3.9). As a result, the high-k dielectric layer can be formed in a thicker layer than silicon dioxide, and yet produce equivalent field effect performance. The relative electrical performance of such high-k dielectric materials is often expressed as EOT, because the high-k material layer may be thicker, while still providing the equivalent electrical effect of a much thinner layer of silicon dioxide. Since the dielectric constant "k" is higher than silicon dioxide, a thicker high-k dielectric layer can be employed to mitigate tunneling leakage currents, while still achieving the equivalent electrical performance of a thinner layer of thermally grown silicon dioxide.

A suitable dielectric may be deposited at block 510 having a dielectric constant substantially higher than that of $SiO_2$, including but not limited to binary metal oxides including aluminum oxide ($Al_2O_3$), zirconium oxide ($ZrO_2$), hafnium oxide ($HfO_2$), lanthanum oxide ($La_2O_3$), yttrium oxide ($Y_2O_3$), titanium oxide ($TiO_2$), as well as their silicates and aluminates; metal oxynitrides including aluminum oxynitride (AlON), zirconium oxynitride (ZrON), hafnium oxynitride (HfON), lanthanum oxynitride (LaON), yttrium oxynitride (YON), as well as their silicates and aluminates such as ZrSiON, HfSiON, LaSiON, YSiON, ZrAlON, HfAlON, etc.; and perovskite-type oxides including a titanate system material such as barium titanate, strontium titanate, barium strontium titanate (BST), lead titanate, lead zirconate titanate, lead lanthanum zirconate titanate, barium lanthanum titanate, barium zirconium titanate; a niobate or tantalate system material such as lead magnesium niobate, lithium niobate, lithium tantalate, potassium niobate, strontium aluminum tantalate and potassium tantalum niobate; a tungsten-bronze system material such as barium strontium niobate, lead barium niobate, barium titanium niobate; and Bi-layered perovskite system material such as strontium bismuth tantalate, bismuth titanate and others.

Continuing at block 512, a photoresist mask is formed over the device that covers NMOS regions in the core and I/O regions, but exposes the PMOS regions in the core and I/O regions. In an alternate aspect, the I/O NMOS region is also exposed for example, if the addition of the high-k dielectric layer yields an EOT greater than a desired EOT already provided solely by the oxide layer.

The high-k dielectric layer is removed from PMOS regions of the core and I/O regions at block 514. A suitable high-k strip process can be employed that is selective to the oxide layer present within the I/O region and the underlying substrate within the core region. The photoresist mask is also then removed by employing a strip procedure that is selective to the high-k layer. It is noted that if the I/O NMOS region is also exposed at block 512, the high-k dielectric layer is also removed from the I/O NMOS region at block 514.

Subsequently, oxide is grown on the silicon substrate in PMOS regions of both the core and I/O regions at block 516 to form a second oxide layer. This oxide growth can be obtained by using thermal and/or plasma oxidation. The exposed high-k dielectric layer in the NMOS regions of the core and I/O regions is also typically oxidized during this process.

The high-k dielectric layer and the second oxide layer are nitrided at block 518. Typically, a thermal or plasma nitridation process is employed. Nitridation of the high-k dielectric layer inhibits dopant diffusion and thermally stabilizes the deposited dielectric materials. Additionally, it makes the high-k dielectric layer less resistant to standard etch chemistries. It is noted that if nitrogen is introduced into the high-k dielectric layer during formation, this block 518 can be omitted, provided that the oxidation in step 516 does not remove a substantial amount of the pre-existing nitrogen in this layer.

A multi-step annealing process can, optionally, be performed to facilitate the performance and operation of the high-k dielectric layer, the oxide layer, and the second oxide layer and the transistor devices in the core and I/O regions that employ the layers. These layers can be subjected to one or more non-oxidizing anneals to densify the dielectric material and one or more oxidizing anneals to mitigate material defects.

Examples of a suitable multi-step anneal process that can be employed with the method of FIG. 5 follows. A multi-step process is performed including one or more pre-nitridation anneals and one or more post-nitridation anneals. The multi-step process may advantageously comprise first and second pre-nitridation anneals, wherein a first anneal is performed at a moderate temperature in an inert non-oxidizing ambient for densifying the deposited high-k material, as well as a second pre-nitridation anneal that is performed in an oxidizing ambient for curing defects and eliminating impurities. Moreover, the post-nitridation annealing can advantageously include a third anneal performed at a high temperature in a non-oxidizing ambient to densify the thermally stabilized high-k material and a fourth anneal in an oxidizing ambient to reduce any remaining defects and impurities.

Dielectric characteristics of NMOS devices within the core region are a function of the composition and thickness of the high-k dielectric layer. Dielectric characteristics of PMOS devices within the core region are a function of the thickness of the second oxide layer (nitrided). Dielectric characteristics of NMOS devices within the I/O region are a function of the composition and thickness of the high-k dielectric layer and the first oxide layer. Dielectric characteristics of PMOS devices within the I/O region are a function of the thickness of the second oxide layer (nitrided) and the first oxide layer.

A conductive electrode layer is then deposited over the device at block 520 and patterned to form conductive gate electrodes in PMOS and NMOS regions of the core and I/O regions. As an example, a polysilicon layer may be deposited via chemical vapor deposition (CVD) and patterned via etching to form gate electrodes in both NMOS and PMOS regions, respectively. In the case of poly-Si electrodes, doping and anneals performed later in the flow ensure that this layer has sufficient conductivity. However, other types of conductive materials, such as metal or metal compounds, can also be employed in accordance with the present invention.

An offset spacer is then formed on lateral edges of the conductive gate electrodes at block 522. For example, a thin offset layer (e.g., an oxide or nitride layer) is formed generally conformally over the patterned gate and then etched using a generally anisotropic dry etch to remove offset layer material on top of the gate and in the source/drain regions, leaving a thin offset spacer material on lateral edges of the gate.

An extension region implant is then performed at block 524 to form extension regions, wherein dopants are introduced in active regions of the device. For example, lightly doped, medium doped or heavily doped extension region implants are performed in the NMOS and PMOS regions, respectively, wherein the gate structure serves to self-align the extension regions. An n-type dopant (e.g., phosphorous) can be implanted with a low energy into the NMOS region to form NMOS extension regions. Similarly, a p-type dopant (e.g., boron) can be implanted with a low energy into the PMOS region to form PMOS extension regions. A thermal process such as a rapid thermal anneal can then be employed to activate the extension region dopants, which causes the extension regions to diffuse laterally slightly underneath the offset spacer toward the channels.

Still referring to FIG. 5, sidewall spacers are then formed on the gate structures at block 526. The sidewall spacers comprise an insulating material such as silicon dioxide, a silicon nitride or a combination of such layers. The spacers are formed by depositing a layer of such spacer material(s) over the device in a generally conformal manner, followed by an anisotropic etch thereof, thereby removing such spacer material from the top of the gate structure and from the moat or active area and leaving a region on the lateral edges of the gate structure, overlying the offset spacers. The sidewall spacers are substantially thicker than the offset spacers, thereby resulting in the subsequently formed source/drain regions to be offset from lateral edges of the gate.

Source/drain regions are then formed in the NMOS and PMOS regions of the core and I/O regions at block 528. Source/drain regions are formed within the NMOS regions by masking the PMOS regions with a resist mask, exposing the NMOS regions, and implanting n-type dopant(s) (e.g., phosphorous). Similarly, source/drain regions are formed within the PMOS regions by masking the NMOS regions with a resist mask, exposing the PMOS regions, and implanting p-type dopant(s) (e.g., boron). The source/drain dopant is introduced into the exposed areas (top of gate electrode and active areas not covered by the sidewall spacers).

Subsequently, other features and/or components of the device can be formed at block 530 ending fabrication at block 532. Conductive contacts can be formed through a PMD layer and portions of the stress inducing liner to provide electrical connection for the transistor terminals. Generally, contact formation comprises forming openings in the PMD layer through suitable masking and etching processes, followed by deposition of conductive material (e.g., tungsten or other suitable materials), and subsequent planarization (e.g., chemical mechanical polishing, etc.). One or more metallization levels are layers can then be formed to provide electrical interconnection of the various electrical components in the device, wherein each metallization level includes an inter-level or inter-layer (ILD) dielectric formed over a preceding level, with vias and/or trenches formed therein and filled with a conductive material. Other typical back-end processing may be performed including hydrogen sintering and other processes that impact stress induced by the strain inducing liner.

Figure 6A:
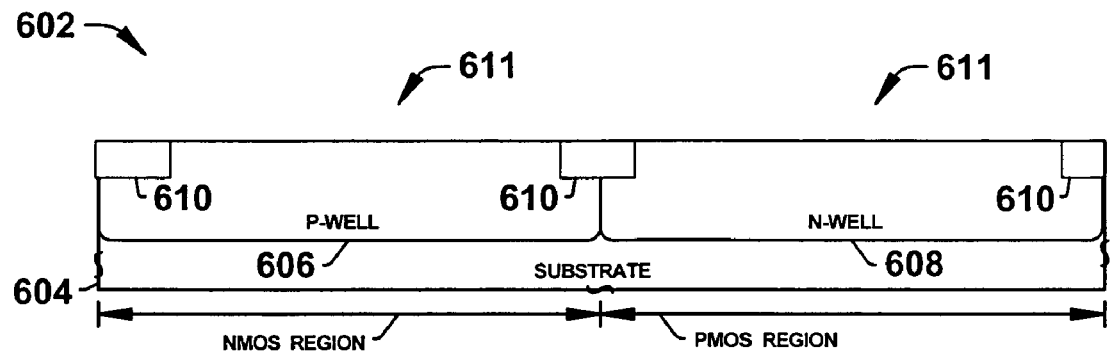
FIGS. 6A-6R are a plurality of fragmentary cross section diagrams illustrating a transistor device having core and I/O regions and being formed in accordance with the present invention by the method of FIG. 5.
Figure 6B:
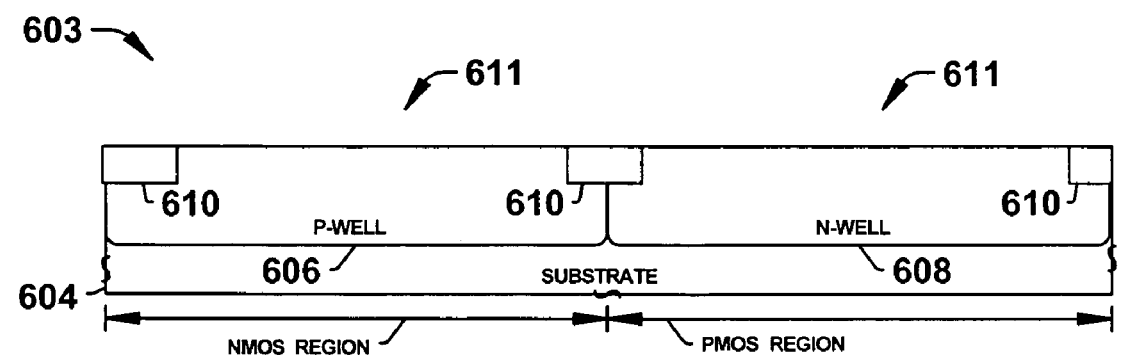
Figure 6C:
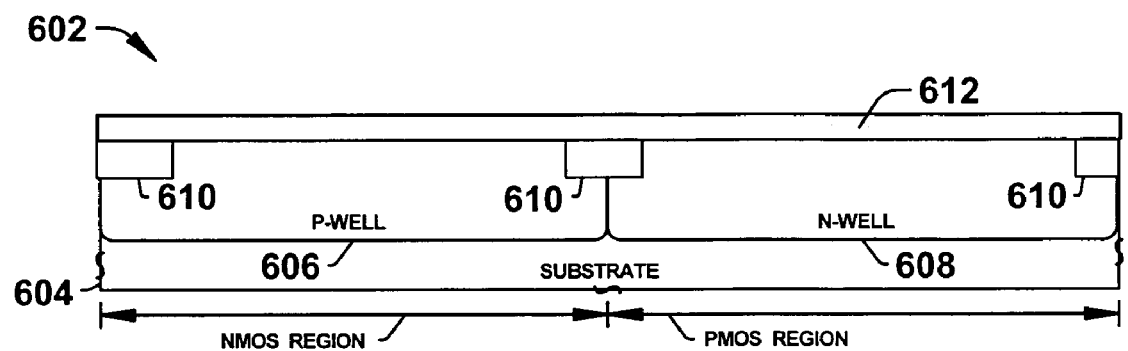
Figure 6D:
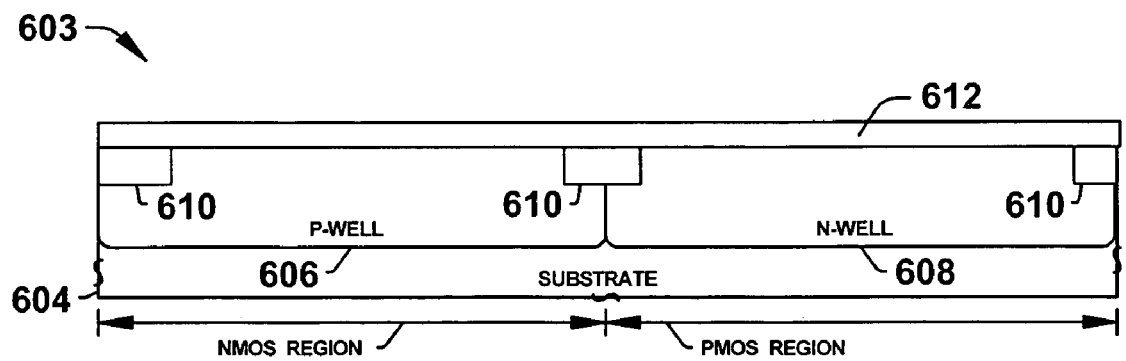
Figure 6E:
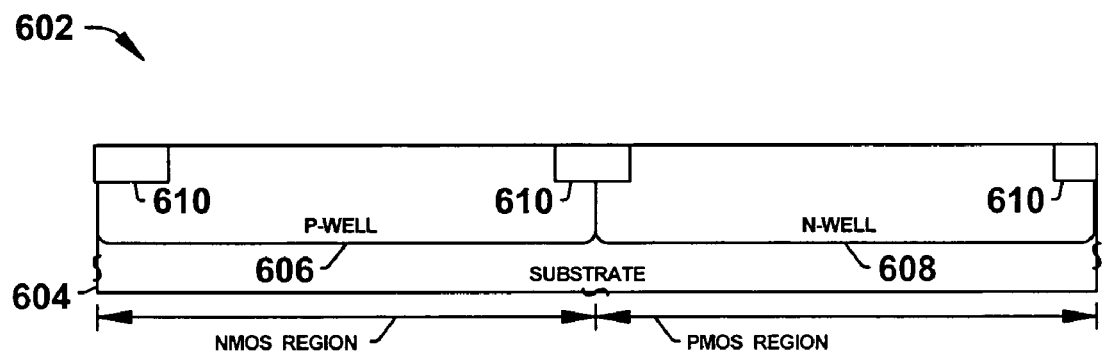
Figure 6F:
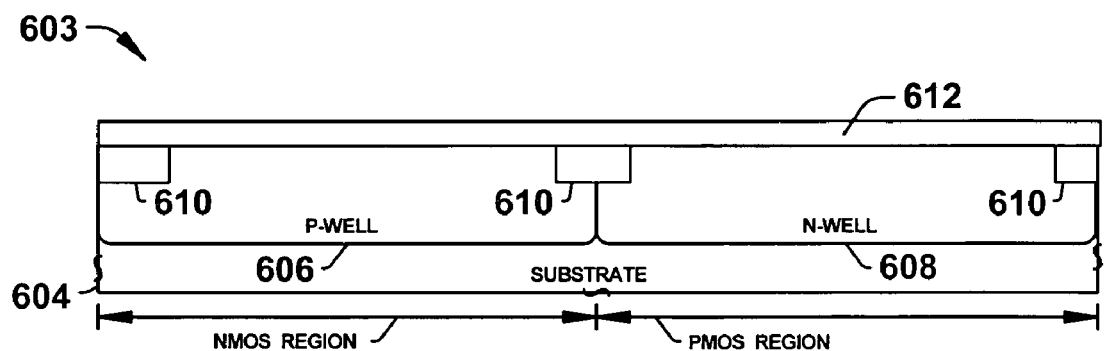
Figure 6G:
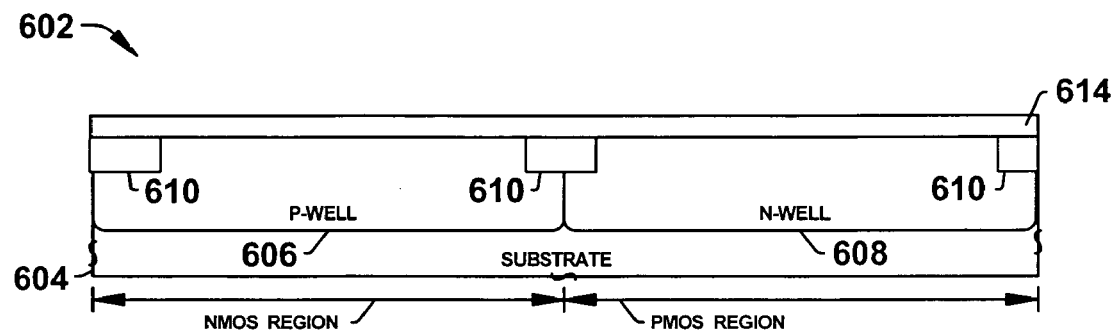
Figure 6H:
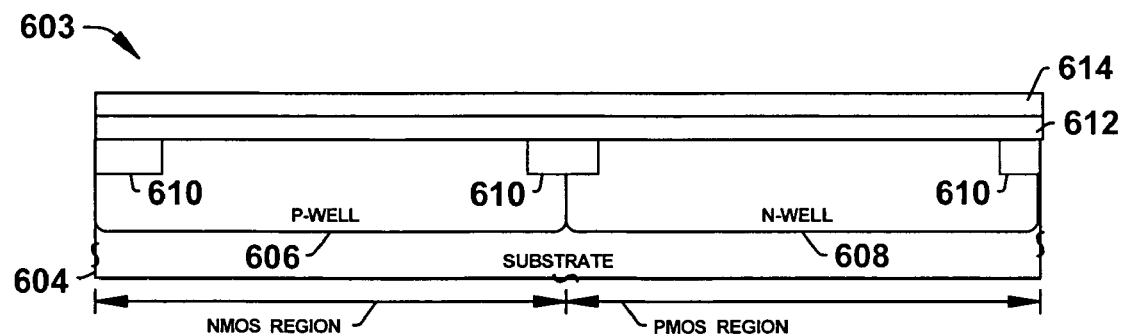
Figure 6I:
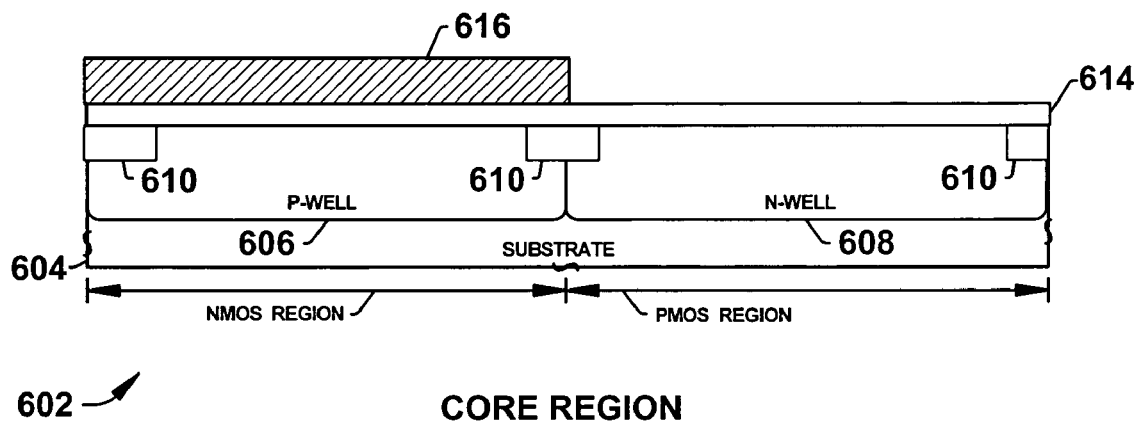
Figure 6J:
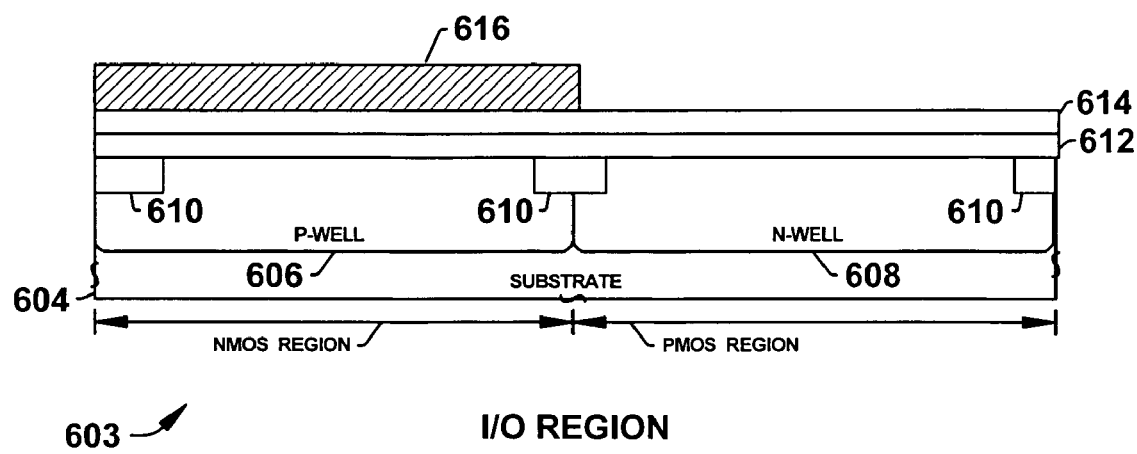
Figure 6K:
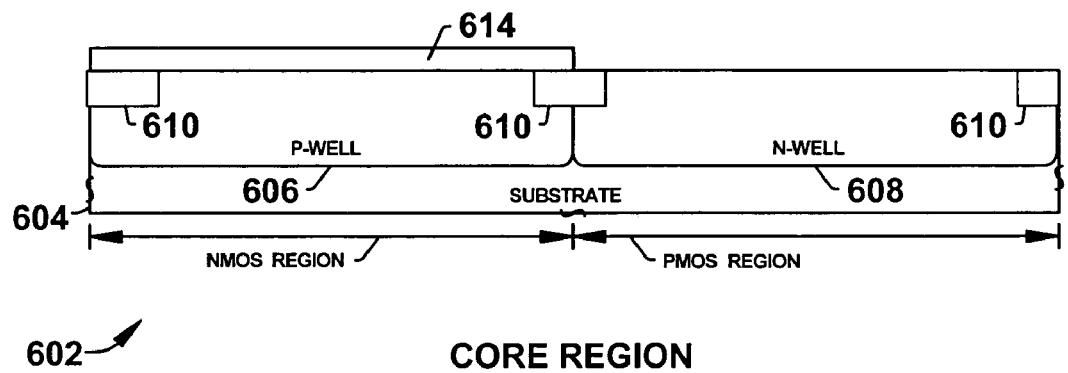
Figure 6L:
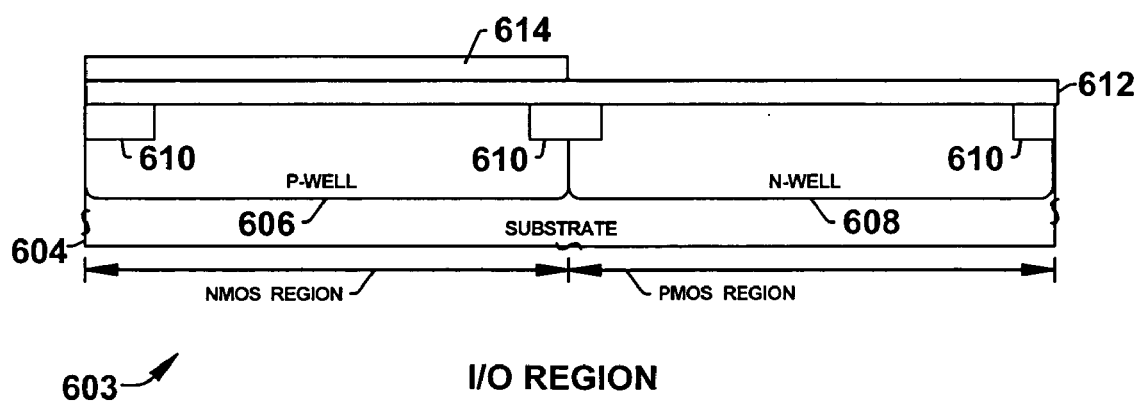
Figure 6M:
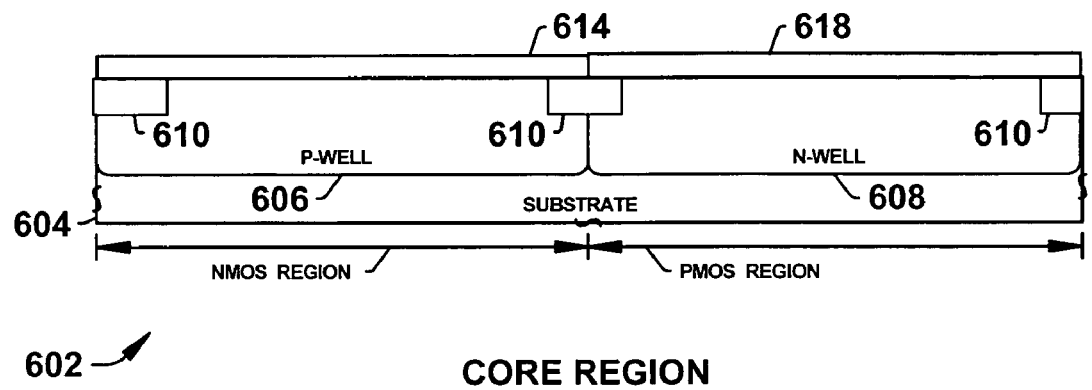
Figure 6N:
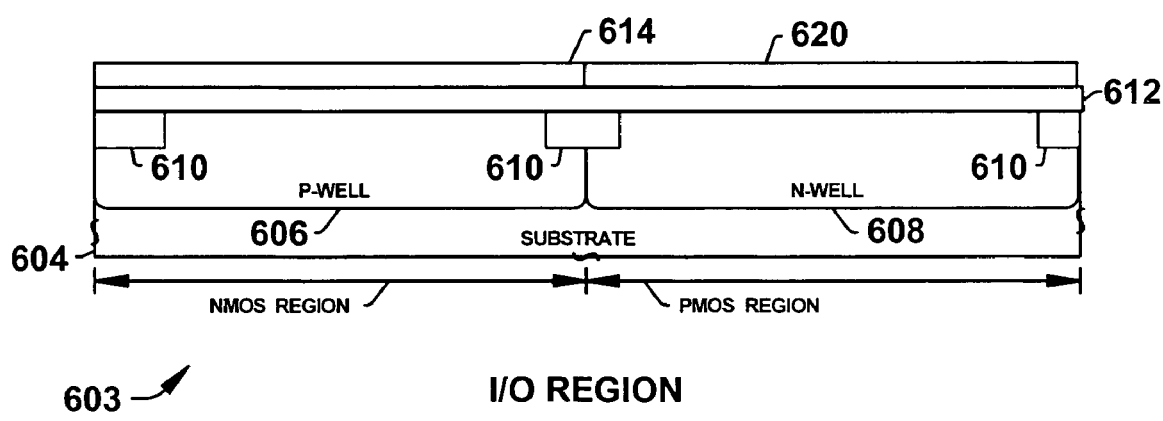
Figure 6O:
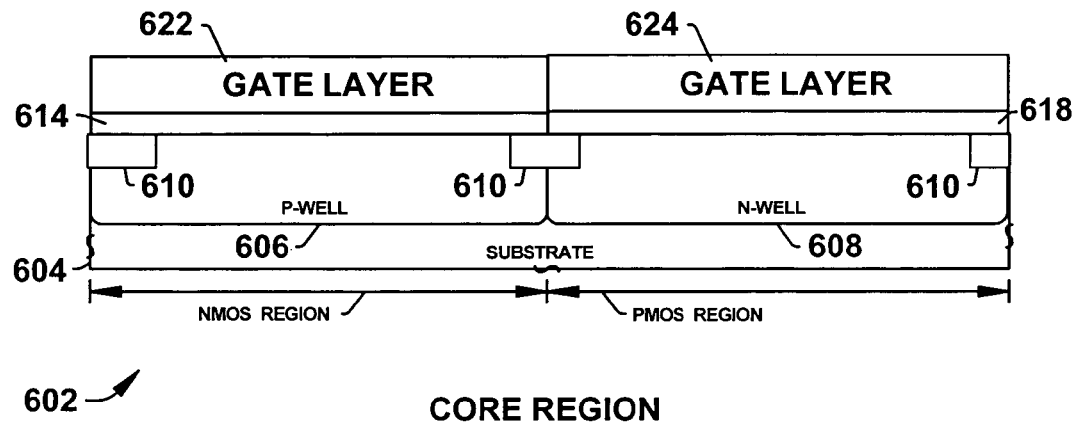
Figure 6P:
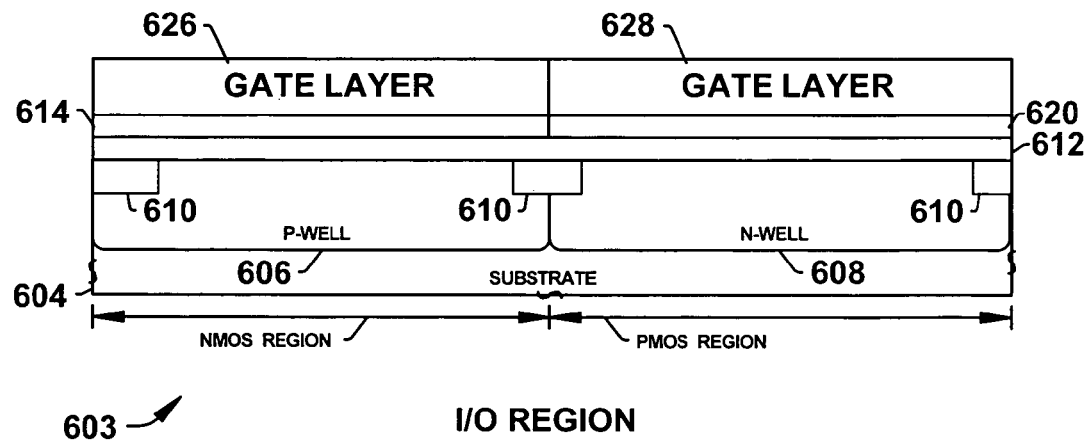
Figure 6Q:
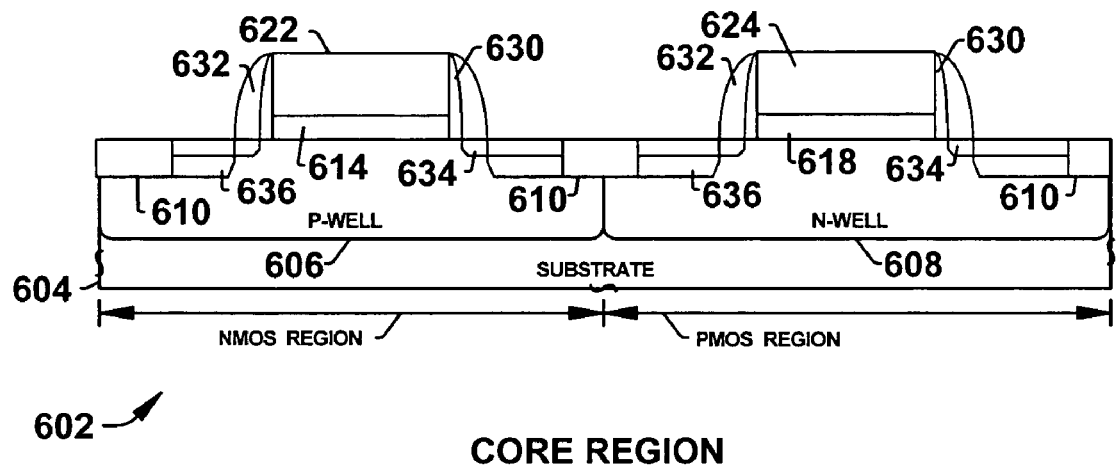
Figure 6R:
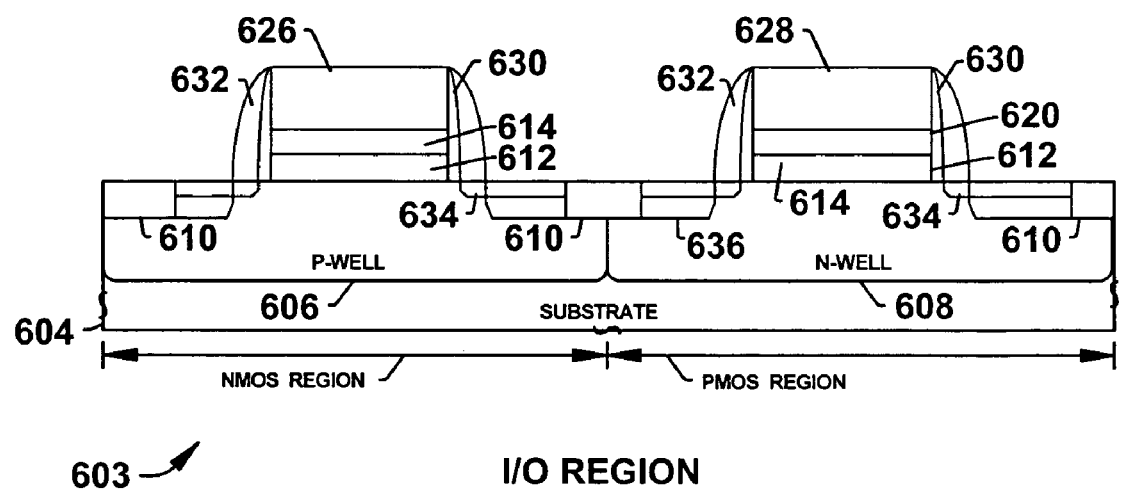

Turning now to FIGS. 6A-6R, a plurality of fragmentary cross section diagrams illustrating a transistor device having core and I/O regions and being formed in accordance with the present invention by the method 500 of FIG. 5 is provided. In FIGS. 6A and 6B, a transistor device is provided, wherein a semiconductor body 604, such as a semiconductor substrate, has a number of wells formed therein, such as a P-well region 606 to define an NMOS transistor device region and an N-well region 608 to define a PMOS transistor device region, respectively. A core region 602 is illustrated in FIG. 6A and an I/O region 603 is illustrated in FIG. 6B. Furthermore, isolation regions 610 such as STI regions are formed in the semiconductor body to define active area regions 611, as may be appreciated. The semiconductor body 604 is comprised of semiconductor materials, such as silicon and/or germanium and can also comprise silicon on insulator, such as Si/SiGe/Si.

In FIGS. 6C and 6D, the transistor device is illustrated, wherein an oxide layer 612 has been formed over the device. The oxide layer 612 is typically grown to a suitable thickness, which is a function of operational characteristics for transistor devices within the I/O region 603. FIGS. 6E and 6F depict removal of the oxide layer 612 from the core region 602. The oxide layer 612 is now only present within the I/O region 603.

A high-k dielectric layer 614 is formed over the device as shown in FIGS. 6G and 6H. In the core region 602 of FIG. 6G, the high-k dielectric layer 614 is substantially formed on the well regions 606 and 608. In the I/O region 603 of FIG. 6H, the high-k dielectric layer 614 is formed on the oxide layer 612.

FIGS. 6I and 6J depict the device after formation of a photoresist mask 616. The mask 616 covers the NMOS regions in the core region 602 and the I/O region 603, but exposes the PMOS regions. An etch process selective to the silicon dioxide layer 612 and the substrate 604 is performed that removes the high-k dielectric layer 614 from the PMOS regions. Subsequently, the photoresist mask 616 is removed. FIGS. 6K and 6L depict the core region 602 and the I/O region 603 after the etch and removal of the photoresist mask.

It is appreciated that alternate aspects of the present invention include formation of a photoresist mask that additionally exposes the I/O NMOS region and, as a result, additionally removes the high-k dielectric layer 614 from the I/O NMOS region during the etch process.

A second silicon dioxide formation process is then performed that grows a second oxide layer 618 in the core region 602 and 620 in the I/O region as shown in FIGS. 6M and 6N. In the core region 602, the second oxide layer 618 is formed on the substrate 604 within the PMOS region. In the I/O region 603, the second oxide layer 620 is formed on the first oxide layer 612. The second oxide layer 620 and the high-k dielectric layer 614 are typically nitrided as described in the method 500 of FIG. 5.

As a result, dielectric characteristics for NMOS devices within the core region 602 are a function of thickness and composition of the high-k dielectric layer. Dielectric characteristics for PMOS devices within the core region 602 are a function of thickness and composition of the second oxide layer 618. Dielectric characteristics for NMOS devices within the I/O region 603 are a function of the thickness and composition of the high-k dielectric layer and the first oxide layer 612. Dielectric characteristics for PMOS devices within the I/O region 603 are a function of the thickness and composition of the first oxide layer 612 and the second oxide layer 620.

Subsequently, conductive gate electrode material is deposited over the device as shown in FIGS. 6O and 6P. Some examples of suitable conductive material that can be employed include polysilicon, metal, and/or metal compounds. An NMOS gate layer 622 is formed within NMOS region of the core region 602. A PMOS gate layer 624 is formed within the PMOS region of the core region 602. An NMOS gate layer 626 is formed within the NMOS region of the I/O region 603. A PMOS gate layer 628 is formed within the PMOS region of the I/O region 603. It is noted that the various gate layers (622, 624, 626, and 628) can, but not necessarily, employ the same conductive material. Additionally, the various gate layers (622, 624, 626, and 628) can, but not necessarily, have varied thicknesses.

FIG. 6Q depicts the core region 602 of the device after formation of source/drain regions 636 and FIG. 6R depicts the I/O region 603 of the device after formation of the source/drain regions 636. After formation of the gate layers 622, 624, 626, and 628, the layers are patterned to form gate structures. Then, offset spacers 630 are formed on lateral edges of the gate structures. The offset spacers serve to align an extension region implant that forms extension regions 634. Afterward, sidewall spacers 632 are formed on the lateral edges of the gate structures adjacent to the offset spacers 630. Continuing, the source/drain regions 636 are formed within the NMOS and PMOS regions by implanting n-type and p-type dopants, respectively.

It is noted that the semiconductor device depicted in FIGS. 6A to 6R is exemplary in nature and intended to facilitate an understanding of the present invention. It is appreciated that variations in thicknesses, layers formed, dimensions, materials employed, and the like are permitted and contemplated in accordance with the present invention.

Figure 7:
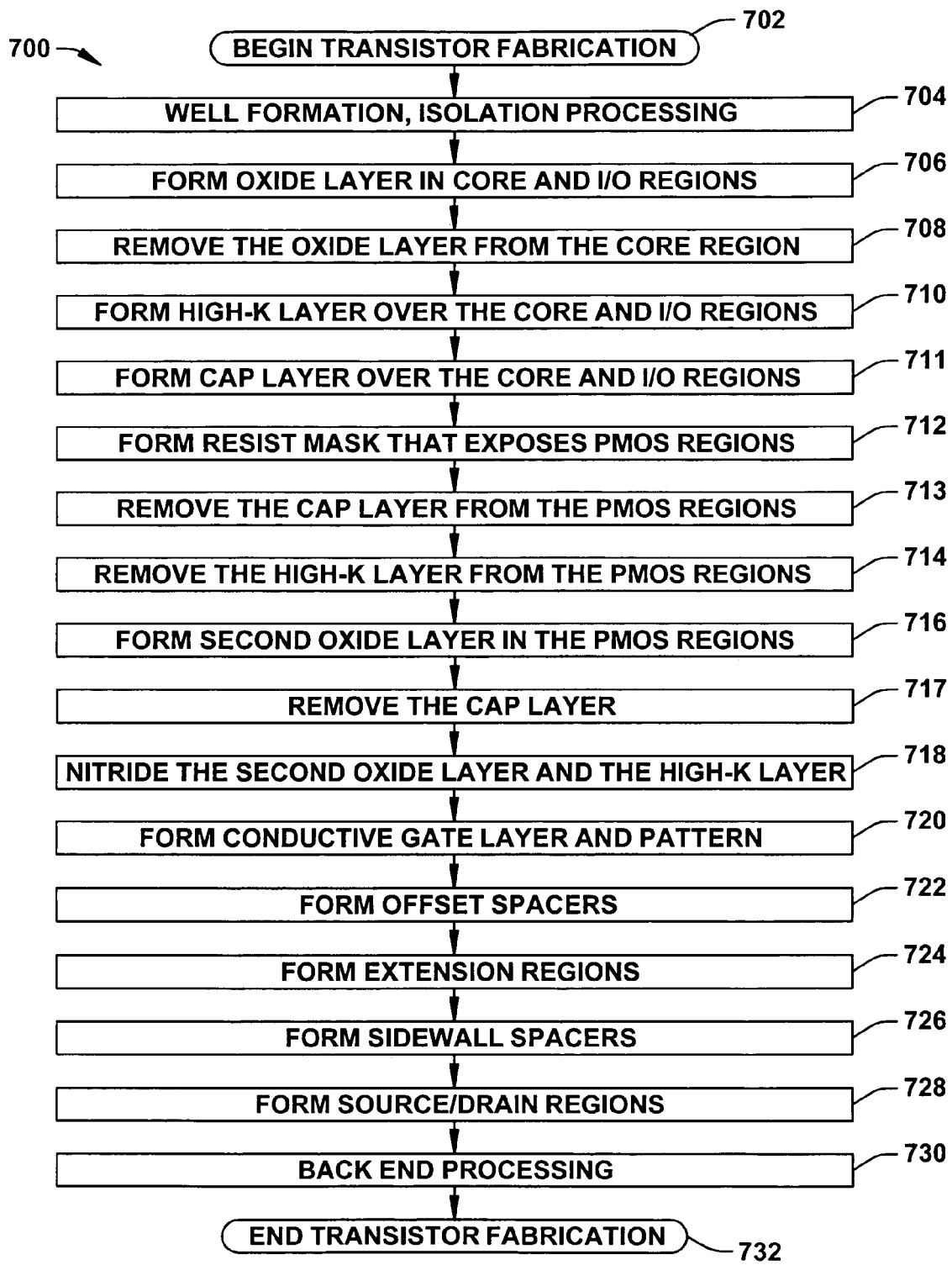
FIG. 7 is a flow diagram illustrating a method of fabricating a CMOS semiconductor device having a core region and an I/O region that employs a cap layer in accordance with an aspect of the present invention.

FIG. 7 is a flow diagram illustrating a method 700 of fabricating a CMOS semiconductor device having a core region and an I/O region that employs a cap layer in accordance with an aspect of the present invention. The method 700 selectively employs high-k dielectric materials for dielectric layers of NMOS devices, but employs silicon oxide or nitrided silicon dioxide for dielectric layers of PMOS devices thereby mitigating or avoiding problems resulting from employing high-k dielectrics with PMOS devices. The cap layer facilitates patterning of high-k dielectric layers and protects underlying layers during stripping and/or etching and oxidation processes.

While the exemplary method 700 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the fabrication of ICs and composite transistors illustrated and described herein, as well as in association with other transistors and structures not illustrated, including but not limited to NMOS and/or PMOS composite transistors.

The method 700 is similar to the method 500 described in FIG. 5. As a result, some details are omitted and can be obtained from the description of the method 500 of FIG. 5.

The method 700 begins at block 702, wherein transistor fabrication is initiated, and transistor well formation and isolation processing is performed at block 704 thereby defining NMOS and PMOS regions within core and I/O regions, wherein NMOS regions comprise a P-well in which n-type source/drain regions will later be formed, and PMOS regions comprise an N-well in which p-type source/drain regions will later be formed, respectively. In addition, isolation regions may comprise shallow trench isolation (STI) or field oxide regions (LOCOS) that serve to define various active areas and electrically isolate various active areas laterally from one another.

The method 700 continues at block 706, wherein a first oxide layer is formed over devices within both the core and I/O regions. In one example, the oxide layer comprises a thin, thermally grown silicon dioxide layer. Subsequently, the oxide layer is patterned at block 708 in order to remove the oxide layer from the core region while retaining the oxide layer in the I/O region.

Continuing, a high-k dielectric layer is formed over the device at block 710 in a blanket operation in both the core and I/O regions. The high-k dielectric layer is formed by depositing a suitable high-k material, such as HfSiON, having a dielectric constant greater than 3.9. Additionally, nitrogen (N) may be introduced during the formation of the high-k dielectric layer or can be added subsequently in a nitridation process. Examples of suitable procedures to form the high-k dielectric layer are provided above with respect to FIG. 5.

Any suitable dielectric may be deposited at block 710 having a dielectric constant higher than that of $SiO_2$, including but not limited to binary metal oxides including aluminum oxide ($Al_2O_3$), zirconium oxide ($ZrO_2$), hafnium oxide ($HfO_2$), lanthanum oxide ($La_2O_3$), yttrium oxide ($Y_2O_3$), titanium oxide ($TiO_2$), as well as their silicates and aluminates; metal oxynitrides including aluminum oxynitride (AlON), zirconium oxynitride (ZrON), hafnium oxynitride (HfON), lanthanum oxynitride (LaON), yttrium oxynitride (YON), as well as their silicates and aluminates such as ZrSiON, HfSiON, LaSiON, YSiON, ZrAlON, HfAlON, etc.; and perovskite-type oxides including a titanate system material such as barium titanate, strontium titanate, barium strontium titanate (BST), lead titanate, lead zirconate titanate, lead lanthanum zirconate titanate, barium lanthanum titanate, barium zirconium titanate; a niobate or tantalate system material such as lead magnesium niobate, lithium niobate, lithium tantalate, potassium niobate, strontium aluminum tantalate and potassium tantalum niobate; a tungsten-bronze system material such as barium strontium niobate, lead barium niobate, barium titanium niobate; and Bi-layered perovskite system material such as strontium bismuth tantalate, bismuth titanate and others.

A cap layer is formed over the device on the high-k dielectric layer at block 711. The cap layer protects the underlying layers and permits greater flexibility in performing later strip, etch and oxidation processes. The cap layer is formed by a deposition process, such as a CVD deposition process, that deposits and forms a suitable material such as, polysilicon, SiGe, Ge, silicon nitride ($Si_3N_4$), silicon carbide (SiC) or carbon-doped $SiO_2$ (SiOC).

Continuing at block 712, a photoresist mask is formed over the device that covers NMOS regions in the core and I/O regions, but exposes the PMOS regions in the core and I/O regions. In an alternate aspect, the I/O NMOS region is also exposed for example, if the high-k dielectric layer yields an EOT greater than a desired EOT already provided solely by the oxide layer.

At block 713, the exposed portions of the cap layer are removed via a patterning process. As a result, the high-k dielectric layer within the PMOS regions of the core and I/O regions is now exposed.

The high-k dielectric layer is removed from PMOS regions of the core and I/O regions at block 714. A suitable high-k strip process can be employed that is selective to the silicon dioxide layer present within the I/O region and the underlying substrate within the core region. The photoresist mask is also then removed by employing a strip procedure that is selective to the high-k and cap layers.

One advantage of employing the cap layer is that it allows more flexibility in the high-k etch chemistry. If the high-k etch also etches photoresist, then a photoresist mask would not be useful here. The cap can also be kept in place after high-k strip and be removed after the oxidation process for the PMOS. In this way, the high-k dielectric is not exposed directly to this oxidation.

Subsequently, silicon dioxide is grown on the silicon substrate in PMOS regions of both the core and I/O regions at block 716 to form a second oxide layer. This oxide growth can be obtained by using thermal and/or plasma oxidation. The exposed cap layer in the NMOS regions of the core and I/O regions is also typically oxidized during this process. Within the PMOS region of the I/O region, the second oxide layer grows from the first oxide layer and forms a single, continuous oxide layer.

The cap layer is stripped at block 717 thereby removing the remaining portions of the cap layer from the NMOS regions of the core and I/O regions. A suitable strip/etch process is employed that is selective to silicon dioxide and the high-k dielectric material. In an alternate aspect of the invention, the cap layer is not removed.

The high-k dielectric layer and the second oxide layer are nitrided at block 718. Typically, a thermal or plasma nitridation process is employed. Nitridation of the high-k dielectric layer inhibits dopant diffusion and thermally stabilizes the deposited dielectric materials. Additionally, it makes the high-k dielectric layer less resistant to standard etch chemistries. It is noted that if nitrogen is introduced into the high-k dielectric layer during formation, this block 718 can be omitted. Additionally, it is also noted that if the cap layer was not removed at block 717, the high-k layer is not nitrided at block 718. In such a case, the cap layer can be removed after the nitridation process of block 718.

A multi-step annealing process can, optionally, be performed before or after the nitridation to facilitate the performance and operation of the high-k dielectric layer, the oxide layer, and the second oxide layer and the transistor devices in the core and I/O regions that employ the layers. These layers can be subjected to one or more non-oxidizing anneals to densify the dielectric material and one or more oxidizing anneals to mitigate material defects.

A conductive gate layer is then deposited over the device at block 720 and patterned to form conductive gate electrodes in PMOS and NMOS regions of the core and I/O regions. As an example, a polysilicon layer may be deposited via chemical vapor deposition (CVD) and patterned via etching to form gate electrodes in both NMOS and PMOS regions, respectively.

An offset spacer is then formed on lateral edges of the conductive gate electrodes at block 722. For example, a thin offset layer (e.g., an oxide or nitride layer) is formed generally conformally over the patterned gate and then etched using a generally anisotropic dry etch to remove offset layer material on top of the gate and in the source/drain regions, leaving a thin offset spacer material on lateral edges of the gate.

An extension region implant is then performed at block 724 to form extension regions, wherein dopants are introduced in active regions of the device. For example, lightly doped, medium doped or heavily doped extension region implants are performed in the NMOS and PMOS regions, respectively, wherein the gate structure serves to self-align the extension regions. A thermal process such as a rapid thermal anneal can then be employed to activate the extension region dopants, which causes the extension regions to diffuse laterally slightly underneath the offset spacer toward the channels.

Still referring to FIG. 7, sidewall spacers are then formed on the gate structures at block 726. The sidewall spacers comprise an insulating material such as an oxide, a nitride or a combination of such layers. The spacers are formed by depositing a layer of such spacer material(s) over the device in a generally conformal manner, followed by an anisotropic etch thereof, thereby removing such spacer material from the top of the gate structure and from the moat or active area and leaving a region on the lateral edges of the gate structure, overlying the offset spacers. The sidewall spacers are substantially thicker than the offset spacers, thereby resulting in the subsequently formed source/drain regions to be offset from lateral edges of the gate.

Source/drain regions are then formed in the NMOS and PMOS regions of the core and I/O regions at block 728. Source/drain regions are formed within the NMOS regions by masking the PMOS regions with a resist mask, exposing the NMOS regions, and implanting n-type dopants (e.g., phosphorous). Similarly, source/drain regions are formed within the PMOS regions by masking the NMOS regions with a resist mask, exposing the PMOS regions, and implanting p-type dopants (e.g., boron). The source/drain dopant is introduced into the exposed areas (top of gate electrode and active areas not covered by the sidewall spacers).

Subsequently, other features and/or components of the device can be formed at block 730 ending fabrication at block 732. Conductive contacts can be formed through a PMD layer and portions of the stress inducing liner to provide electrical connection for the transistor terminals. Generally, contact formation comprises forming openings in the PMD layer through suitable masking and etching processes, followed by deposition of conductive material (e.g., tungsten or other suitable materials), and subsequent planarization (e.g., chemical mechanical polishing, etc.). One or more metallization levels are layers can then be formed to provide electrical interconnection of the various electrical components in the device, wherein each metallization level includes an inter-level or inter-layer (ILD) dielectric formed over a preceding level, with vias and/or trenches formed therein and filled with a conductive material. Other typical back-end processing may be performed including hydrogen sintering and other processes that impact stress induced by the strain inducing liner.

Turning now to FIGS. 8A-8D, a plurality of fragmentary cross section diagrams illustrating a transistor device having core and I/O regions and being formed in accordance with the present invention by the method 700 of FIG. 7 is provided. The cross sections depict formation and patterning of the cap layer in order to facilitate selective removal of a high-k dielectric layer from PMOS regions of the device. A limited number of cross sections are provided to illustrate the cap layer. The cross section figures of FIGS. 6A-6R can be referenced for additional detail.

Figure 8A:
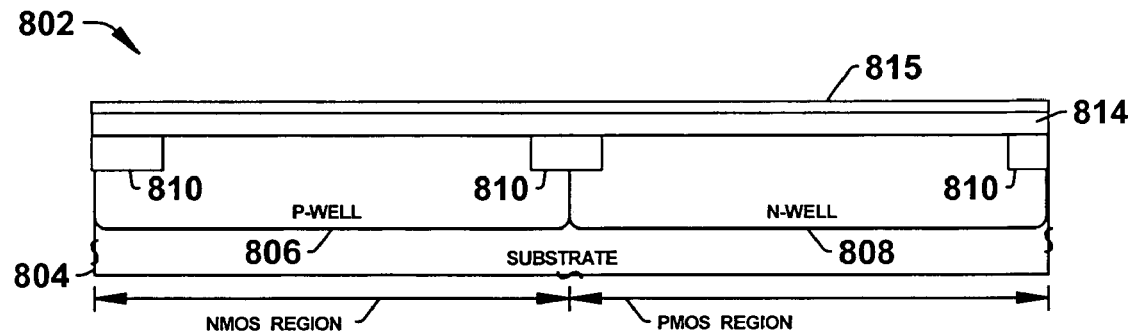
FIGS. 8A-8D are a plurality of fragmentary cross section diagrams illustrating a transistor device having core and I/O regions and being formed in accordance with the present invention by the method of FIG. 7.
Figure 8B:
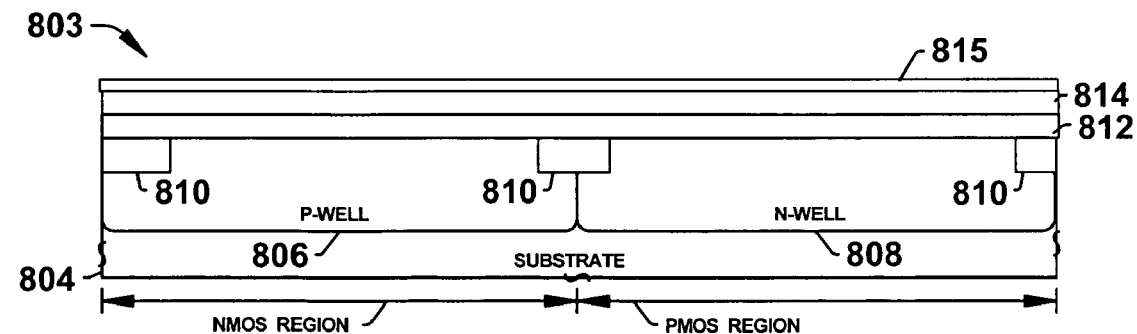

In FIGS. 8A and 8B, a transistor device is provided, wherein a semiconductor body 804, such as a semiconductor substrate, has a number of wells formed therein, such as a P-well region 806 to define an NMOS transistor device region and an N-well region 808 to define a PMOS transistor device region, respectively. A core region 802 is illustrated in FIG. 8A and an I/O region 803 is illustrated in FIG. 8B. Furthermore, isolation regions 810 such as STI regions are formed in the semiconductor body to define active area regions. An oxide layer 812 is formed over the device and patterned to be removed from the core region 802 such that it remains in only the I/O region 803, as shown in FIG. 8B. A high-k dielectric layer 814 is formed over the device and is formed on the semiconductor body 804 as shown in FIG. 8A. The high-k dielectric layer 814 is formed on the oxide layer 812 in the I/O region as shown in FIG. 8B. A cap layer 815 comprised of poly silicon or silicon nitride ($Si_3N_4$) is formed over the device and on the high-k dielectric layer 814 in both the core region 802 and the I/O region 803.

Figure 8C:
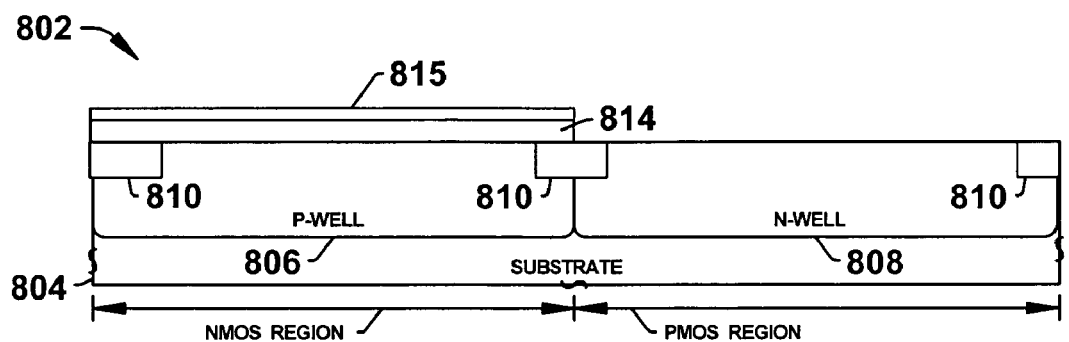
Figure 8D:
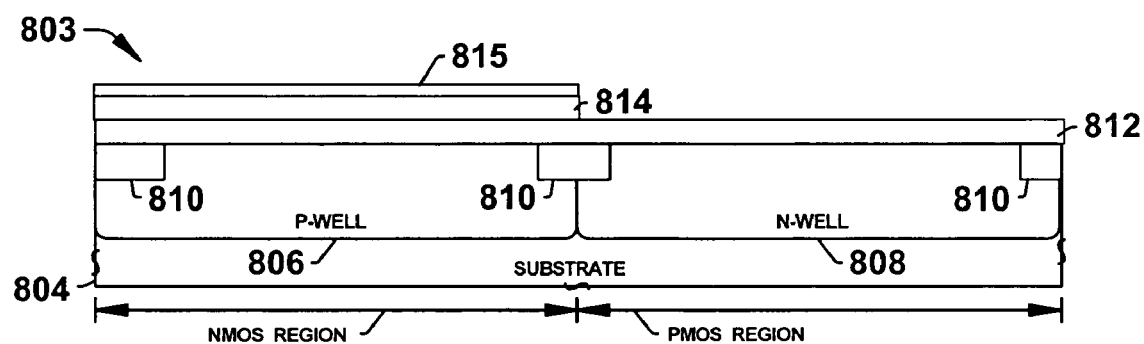

Subsequently, a resist mask (not shown) is employed to remove the cap layer 815 from the NMOS regions. The remaining cap layer 815 is employed as a mask to selectively remove the high-k dielectric layer 814 from the PMOS regions. FIGS. 8C and 8D depict the device at this stage of fabrication wherein the cap layer is removed from the PMOS region in both the core 802 and I/O 803 regions. Further fabrication of the device continues according to the method 700 of FIG. 7. FIGS. 6A to 6R can be referenced for additional structural details which are omitted here.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method of fabricating a semiconductor device comprising:
   forming well regions and isolation regions within a semiconductor body defining PMOS and NMOS regions of first and second regions;
   forming a first oxide layer on a semiconductor body within the first region and the second region;
   removing the first oxide layer from the first region;
   forming a high-k dielectric layer over the first and second regions;
   selectively removing the high-k dielectric layer from the PMOS regions of the first and second regions;
   forming a second oxide layer on the first oxide layer within the PMOS region of the second region and the second oxide layer on the semiconductor body within the PMOS region of the first region; and
   forming a gate layer over the device.

2. The method of claim 1, wherein the second region is designated for higher voltage operation than the first region.

3. The method of claim 1, wherein the first region is a core region and the second region is a I/O region.

4. The method of claim 1, further comprising forming a resist mask that exposes the PMOS regions of the first and second regions prior to removing the high-k layer from the PMOS regions.

5. The method of claim 1, further comprising patterning the gate layer, the high-k dielectric layer, the first oxide layer, and the second oxide layer to form gate structures.

6. The method of claim 1, wherein forming the high-k dielectric layer comprises depositing HfSiO.

7. The method of claim 1, wherein forming the high-k dielectric layer comprises depositing HfSiON.

8. The method of claim 1, further comprising nitriding the second oxide layer and the high-k dielectric layer prior to forming the gate layer.

9. The method of claim 1, wherein forming the gate layer comprises depositing polysilicon over the device.

10. The method of claim 1, wherein forming the high-k dielectric layer comprises forming the high-k dielectric layer with a thickness selected according to operational characteristics of NMOS devices within the first region.

11. The method of claim 1, wherein forming the second oxide layer comprises forming the second oxide layer with a thickness selected according to operational characteristics of PMOS devices within the first region.

12. The method of claim 1, further comprising selectively removing the high-k dielectric layer from the NMOS region of the second region and forming the second oxide layer on the first oxide layer within the NMOS region of the second region.

13. A method of fabricating a semiconductor device comprising:
- forming well regions and isolation regions within a semiconductor body defining PMOS and NMOS regions of first and second regions;
- forming a first oxide layer on a semiconductor body within the first region and the second region;
- removing the first oxide layer from the first region;
- forming a high-k dielectric layer over the first and second regions;
- forming a cap layer over the first and second regions;
- forming a photoresist mask that exposes the cap layer within the PMOS regions of the first and second regions;
- removing the cap layer from the PMOS regions of the first and second regions;
- selectively removing the high-k dielectric layer from the PMOS regions of the first and second regions using the cap layer as a mask;
- removing the photoresist mask;
- forming a second oxide layer on the first oxide layer within the PMOS region of the second region and the second layer on the semiconductor body within the PMOS region of the core region; and
- removing the cap layer.

14. The method of claim 13, wherein the first region is a core region and the second region is a I/O region.

15. The method of claim 13, further comprising forming a gate layer over the device.

16. The method of claim 13, wherein forming the cap layer comprises depositing polysilicon.

17. The method of claim 13, wherein forming the cap layer comprises depositing silicon nitride.

18. The method of claim 13, further comprising nitriding the second oxide layer prior to removing the cap layer.

19. The method of claim 13, further comprising nitriding the second oxide layer and the high-k dielectric layer after removing the cap layer.

20. A method of fabricating a semiconductor device comprising:
- selecting core PMOS dielectric characteristics for PMOS devices within a PMOS region of a core region;
- selecting core NMOS dielectric characteristics for NMOS devices within a NMOS region of the core region;
- selecting I/O PMOS dielectric characteristics for PMOS devices within a PMOS region of a I/O region;
- selecting I/O NMOS dielectric characteristics for NMOS devices within a NMOS region of the I/O region;
- forming a first oxide layer over the device within the core region and the I/O region with a thickness at least partially selected according to the I/O PMOS dielectric characteristics and the I/O NMOS dielectric characteristics;
- removing the first oxide layer from the core region;
- forming a high-k dielectric layer over the core and I/O regions having a thickness selected according to the selected core NMOS dielectric characteristics;
- selectively removing the high-k dielectric layer from the PMOS regions of the core and I/O regions; and
- forming a second oxide layer on the first oxide layer within the PMOS region of the I/O region and the second layer on the semiconductor body within the PMOS region of the core region having a thickness selected according to the core PMOS dielectric characteristics and the I/O PMOS dielectric characteristics.

21. The method of claim 20, further comprising performing a nitridation process after forming the second oxide layer.

22. The method of claim 20, wherein forming the high-k dielectric comprises depositing HfSiON.

23. The method of claim 20, wherein selecting the core PMOS dielectric characteristics comprises selecting a desired threshold voltage.

24. The method of claim 20, wherein selecting the I/O NMOS dielectric characteristics comprises selecting a desired drive current.

* * * * *